United States Patent
Sun et al.

(10) Patent No.: US 11,424,257 B2
(45) Date of Patent: Aug. 23, 2022

(54) METHOD FOR MANUFACTURING SEMICONDUCTOR STRUCTURE AND CAPABLE OF CONTROLLING THICKNESSES OF OXIDE LAYERS

(71) Applicant: eMemory Technology Inc., Hsin-Chu (TW)

(72) Inventors: Wein-Town Sun, Hsinchu County (TW); Chun-Hsiao Li, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 241 days.

(21) Appl. No.: 16/853,764

(22) Filed: Apr. 21, 2020

(65) Prior Publication Data

US 2021/0111273 A1    Apr. 15, 2021

Related U.S. Application Data

(60) Provisional application No. 62/915,619, filed on Oct. 15, 2019.

(51) Int. Cl.
| | |
|---|---|
| *H01L 21/00* | (2006.01) |
| *H01L 27/11531* | (2017.01) |
| *H01L 27/11524* | (2017.01) |
| *H01L 27/11529* | (2017.01) |
| *H01L 29/06* | (2006.01) |
| *H01L 29/66* | (2006.01) |
| *H01L 29/788* | (2006.01) |

(52) U.S. Cl.
CPC .. *H01L 27/11531* (2013.01); *H01L 27/11524* (2013.01); *H01L 27/11529* (2013.01); *H01L 29/0649* (2013.01); *H01L 29/66825* (2013.01); *H01L 29/7884* (2013.01)

(58) Field of Classification Search
CPC ......... H01L 27/11531; H01L 27/11524; H01L 27/11529; H01L 29/0649; H01L 29/66825; H01L 29/7884
See application file for complete search history.

(56) References Cited

U.S. PATENT DOCUMENTS

| | | | |
|---|---|---|---|
| 8,501,562 B1 | 8/2013 | Horch | |
| 2002/0100930 A1* | 8/2002 | Yaegashi | H01L 27/11526 438/257 |
| 2011/0044112 A1* | 2/2011 | Torii | G11C 16/0433 257/315 |
| 2011/0318897 A1 | 12/2011 | Shang | |
| 2012/0129317 A1 | 5/2012 | Funayama | |
| 2016/0181261 A1 | 6/2016 | Wu | |

* cited by examiner

*Primary Examiner* — Richard A Booth

(74) *Attorney, Agent, or Firm* — Winston Hsu

(57) ABSTRACT

A method for manufacturing a semiconductor structure includes forming a first oxide layer on a wafer; forming a silicon nitride layer on the first oxide layer; forming a plurality of trenches; filling an oxide material in the trenches to form a plurality of shallow trench isolation regions; removing the silicon nitride layer without removing the first oxide layer; using a photomask to apply a photoresist for covering a first part of the first oxide layer on a first area and exposing a second part of the first oxide layer on a second area; and removing the second part of the first oxide layer while remaining the first part of the first oxide layer.

13 Claims, 12 Drawing Sheets

METHOD FOR MANUFACTURING SEMICONDUCTOR STRUCTURE AND CAPABLE OF CONTROLLING THICKNESSES OF OXIDE LAYERS

CROSS REFERENCE TO RELATED APPLICATIONS

This application claims priority to provisional Patent Application No. 62/915,619, filed 2019 Oct. 15, and incorporated herein by reference in its entirety.

BACKGROUND OF THE INVENTION

1. Field of the Invention

The disclosure is related to a method for manufacturing a semiconductor structure, and more particularly, a method for manufacturing a semiconductor structure and capable of controlling thicknesses of oxide layers.

2. Description of the Prior Art

In a memory device, a program operation can be performed by pulling electrons into a gate terminal (e.g., a floating gate terminal) with the hot carrier injection (HEI) effect. An erase operation can be performed by pulling electrons out of a gate terminal with the Fowler-Nordheim (F-N) tunneling effect.

To properly perform a program operation and an erase operation, the thickness of an oxide layer of the gate terminal should be well controlled. However, it is difficult to control the thickness of an oxide layer.

When the oxide layer is overly thick, it is difficult to pull electrons into or out of a gate terminal, and the program operation and the erase operation will fail.

When the oxide layer is overly thin, electrons stored in the gate terminal will unexpectedly escape to generate leakage currents, and more defects will occur to worsen reliability.

As above, it has been a challenge to control the thickness of the oxide layer of a memory device, and another challenge is to further consider an input/output (IO) device.

An oxide layer of an IO device should have a proper thickness according to an operation voltage of the IO voltage. However, an IO device and a memory device are formed on the same wafer, and the oxide layer of the IO device may be formed along with the oxide layer of the memory device. This will cause the oxide layer of the memory device to be too thick or too thin.

Hence, a proper solution is in need to separately and accurately control the thicknesses of oxide layers of memory device and input/output (IO) device.

SUMMARY OF THE INVENTION

An embodiment provides a method for manufacturing a semiconductor structure. The method includes forming a first oxide layer on a wafer; forming a silicon nitride layer on the first oxide layer; forming a plurality of trenches; filling an oxide material in the trenches to form a plurality of shallow trench isolation regions; performing a polishing process to planarize a surface of the silicon nitride layer; removing the silicon nitride layer without removing the first oxide layer; using a photomask to apply a photoresist for covering a first part of the first oxide layer on a first area and exposing a second part of the first oxide layer on a second area; and removing the second part of the first oxide layer while remaining the first part of the first oxide layer.

Another embodiment provides a method for manufacturing a semiconductor structure. The method includes forming a first oxide layer on a wafer; forming a silicon nitride layer on the first oxide layer; forming a plurality of trenches; filling an oxide material in the trenches to form a plurality of shallow trench isolation regions; performing a polishing process to planarize a surface of the silicon nitride layer; removing the silicon nitride layer and the first oxide layer; forming a second oxide layer; implanting ions to form a plurality of well regions; using a first photomask to apply a first photoresist for covering a first part of the second oxide layer on a first area and exposing a second part of the second oxide layer on a second area; and removing the second part of the second oxide layer while remaining the first part of the second oxide layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
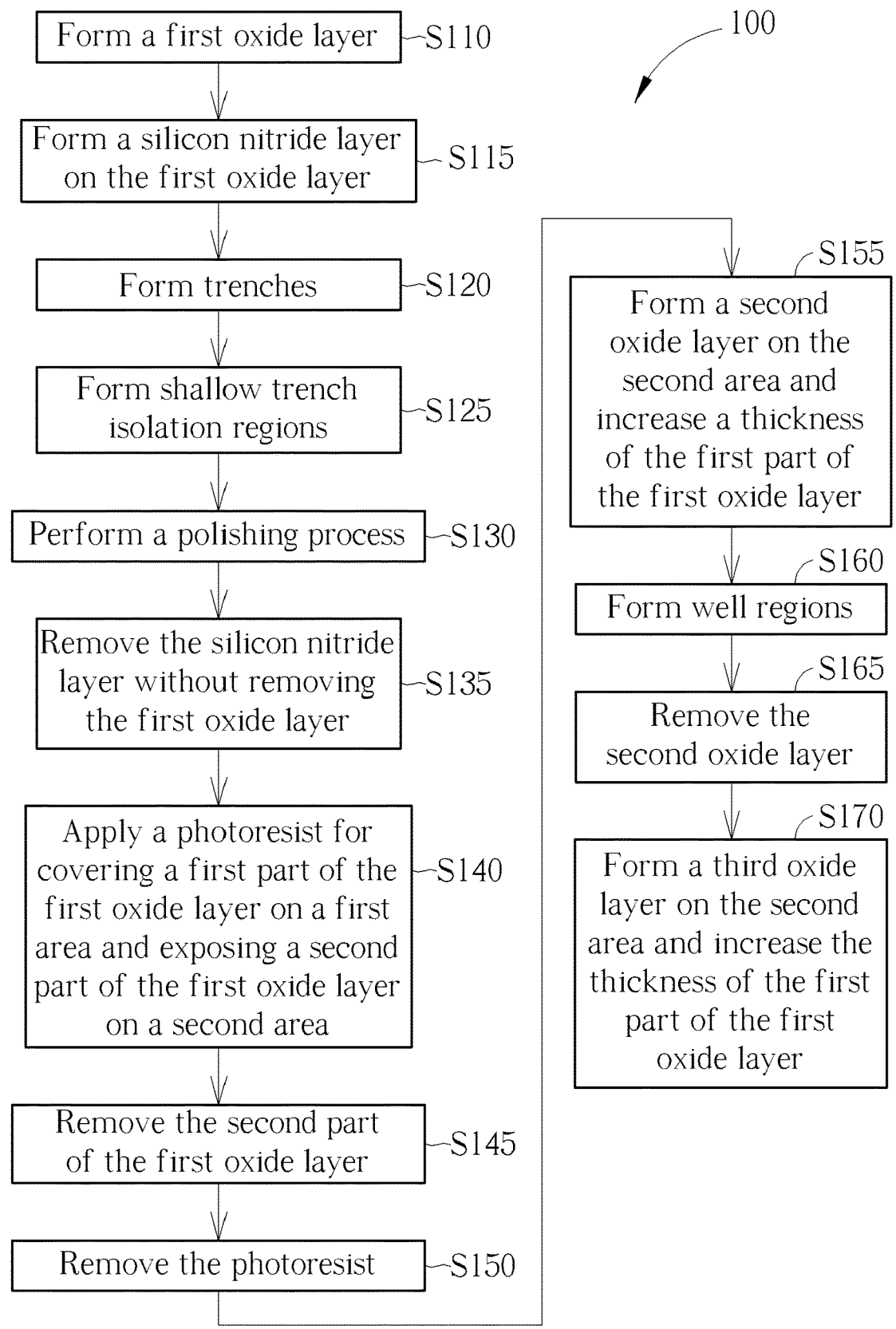
FIG. 1 is a flowchart of a method for manufacturing a semiconductor structure according to an embodiment.

FIG. 1 is a flowchart of a method 100 for manufacturing a semiconductor structure 1 according to an embodiment. FIG. 2 to FIG. 8 are cross sectional views during the manufacturing process of the semiconductor structure 1.

Figure 2:
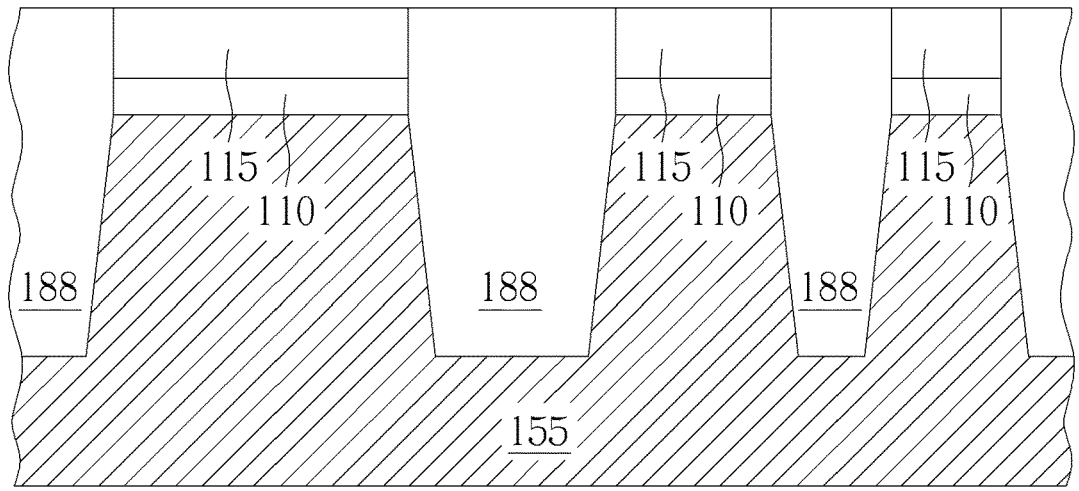
FIG. 2 to FIG. 8 illustrate the process of performing the method of FIG. 1.
Figure 3:
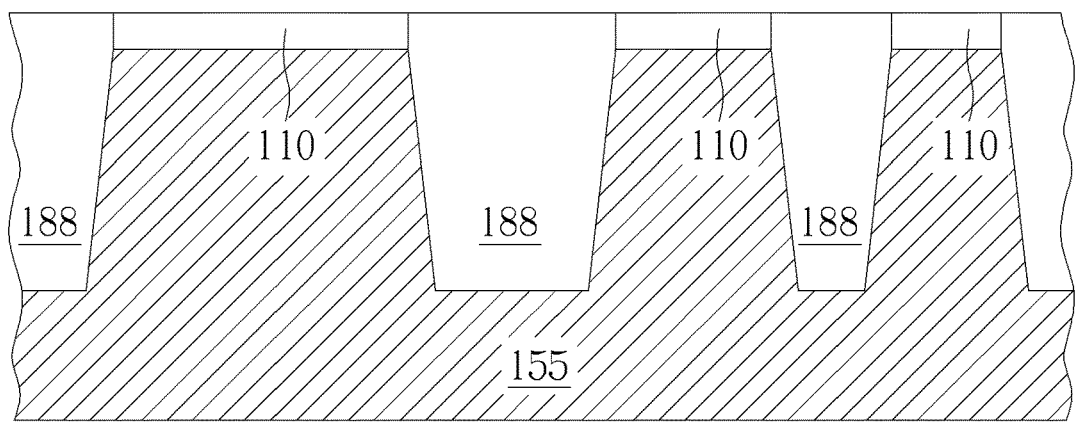

Steps S110 to S130 may be corresponding to FIG. 2. Step S135 may be corresponding to FIG. 3. Steps S140 to S145 may be corresponding to FIG. 4. Steps S150 to S155 may be corresponding to FIG. 5. Step S160 may be corresponding to FIG. 6. Step S165 may be corresponding to FIG. 7. Step S170 may be corresponding to FIG. 8.

The method 100 may include the following steps.

Step S110: form a first oxide layer 110 on a wafer 155;

Step S115: form a silicon nitride layer 115 on the first oxide layer 110;

Step S120: form a plurality of trenches;

Step S125: fill an oxide material in the trenches to form a plurality of shallow trench isolation regions 188;

Step S130: perform a polishing process to planarize the surface of the silicon nitride layer 115;

Step S135: remove the silicon nitride layer 115 without removing the first oxide layer 110;

Step S140: use a photomask to apply a photoresist 166 for covering a first part of the first oxide layer 110 on a first area A1 and exposing a second part of the first oxide layer 110 on a second area A2;

Step S145: remove the second part of the first oxide layer 110 while remaining the first part of the first oxide layer 110;

Step S150: remove the photoresist 166;

Step S155: perform a first oxidation process to form a second oxide layer 120 on the second area A2 and increase a thickness of the first part of the first oxide layer 110;

Step S160: implant ions to form a plurality of well regions W1, W2 and W3;

Step S165: remove the second oxide layer 120; and

Step S170: perform a second oxidation process to form a third oxide layer 130 on the second area A2 and increase the thickness of the first part of the first oxide layer 110.

According to an embodiment, in FIG. 1 to FIG. 8, the first oxide layer 110 may be a pad oxide layer. The second oxide layer 120 may be a sacrificial oxide layer. The third oxide layer 130 may be a gate oxide layer of an input/output (IO) device also known as an IO gate oxide layer.

A pad oxide layer may be generated using a chemical vapor deposition (CVD) process or a thermal oxidation process, and be formed between a silicon material and a silicon nitride layer to prevent physical strain due to temperature changes or other causes. A sacrificial oxide layer may be used to reduce damages caused by ion implantation. A thickness of an IO gate oxide layer may be adjusted to a proper value according to an operation voltage of the IO device; otherwise, the IO device cannot properly operate with the operation voltage.

In FIG. 2 to FIG. 8, the first area A1 may be corresponding to a memory device, and the second area A2 may be corresponding to an IO device.

In Step S125, the oxide material filled in the trenches may be silicon dioxide ($SiO_2$).

In Step S130, the polishing process may be a chemical-mechanical polishing (CMP) process, also known as a chemical-mechanical planarization process.

In Step S135, phosphoric acid (e.g., $H_3PO_4$) or other suitable chemicals may be used to remove the silicon nitride layer 115 by an etching process.

Figure 4:
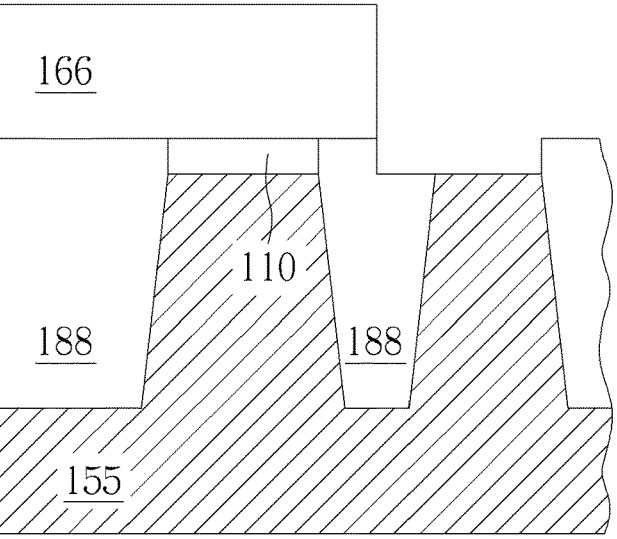
Figure 5:
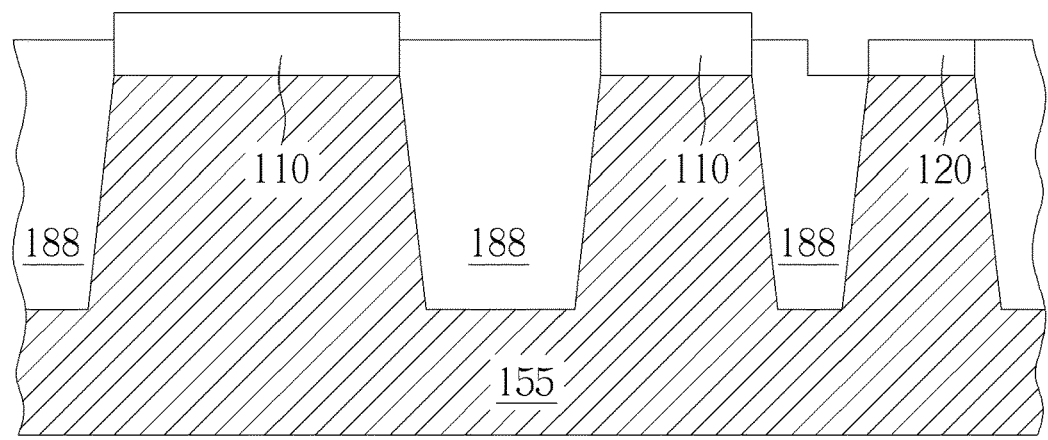

In Steps S140 to S150, a part of the first oxide layer 110 may be selectively removed as shown in FIG. 4 by means of the photomask. The second part of the first oxide layer 110 which is not covered by the photoresist 166 may be removed with an etching process. For example, hydrofluoric acid (e.g., HF) or other suitable chemicals may be used in the etching process.

In Step S155 and Step S170, each of the first oxidation process and the second oxidation process may include one of a physical vapor deposition (PVD) process, a chemical vapor deposition (CVD) process, a plasma-enhanced chemical vapor deposition (PECVD) process and a thermal oxidation process.

In Step S155, if the second oxide layer 120 is formed using a deposition process such as a PECVD process, the thickness of the first part of the first oxide layer 110 may be increased from top because additional oxide material may be deposited onto the first oxide layer 110.

In another case, in Step S155, if the second oxide layer 120 is formed using a thermal oxidation process, the thickness of the first part of the first oxide layer 110 may be increased from bottom because oxygen ions may move into the bottom of the first part of the first oxide layer 110 to generate additional oxide material. However, no matter a deposition process or a thermal oxidation process is used, a similar structure can be formed.

Figure 6:
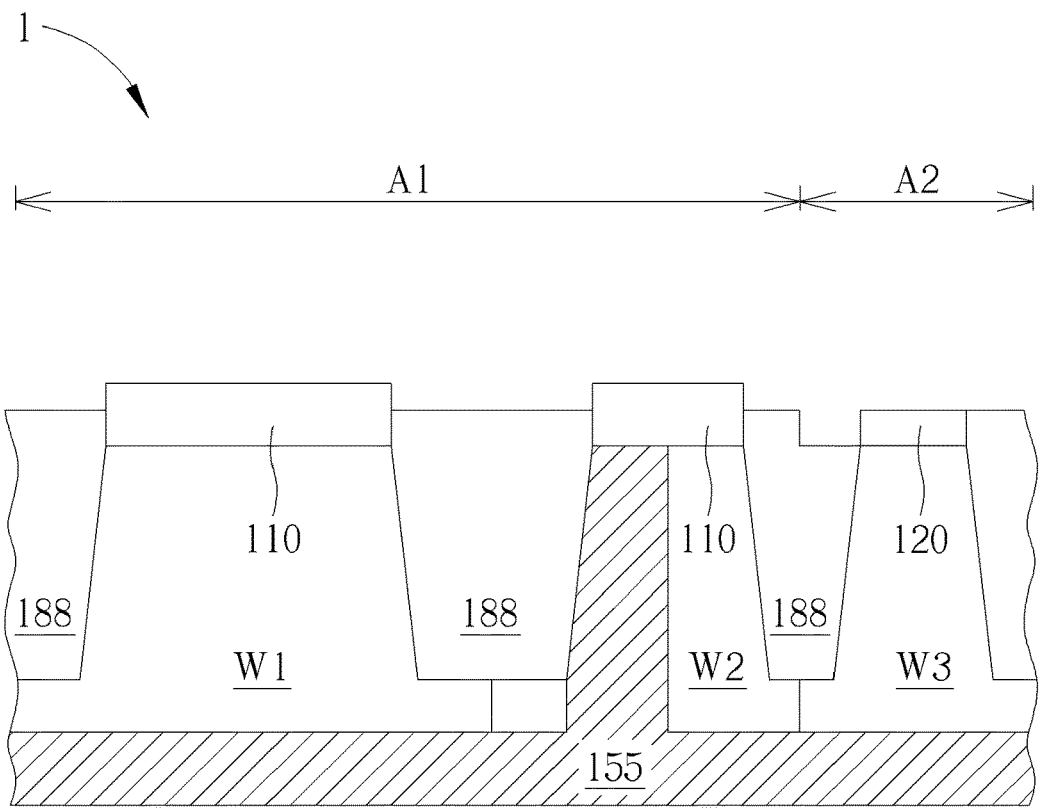

In Step S160 and FIG. 6, ions may be implanted through the first oxide layer 110 and the second oxide layer 120, so the quality of the first oxide layer 110 and the second oxide layer 120 may be deteriorated. In order to have an IO gate oxide layer with a higher quality and a more optimized thickness, the second oxide layer 120 is removed as mentioned in FIG. 7 and Step S165, and the third oxide layer 130 is newly formed as shown in FIG. 8 and Step S170.

As shown in FIG. 6, the types of the wells W1, W2 and W3 may be determined by the ions implanted. For example, the wells W1, W2 and W3 may be (but not limited to) an n-type well, a p-type well and an n-type well respectively.

In this example, the wells W1 and W2 may be used to generate elements of a non-volatile memory (NVM), and the well W3 may be used to generate elements of an IO device.

Figure 7:
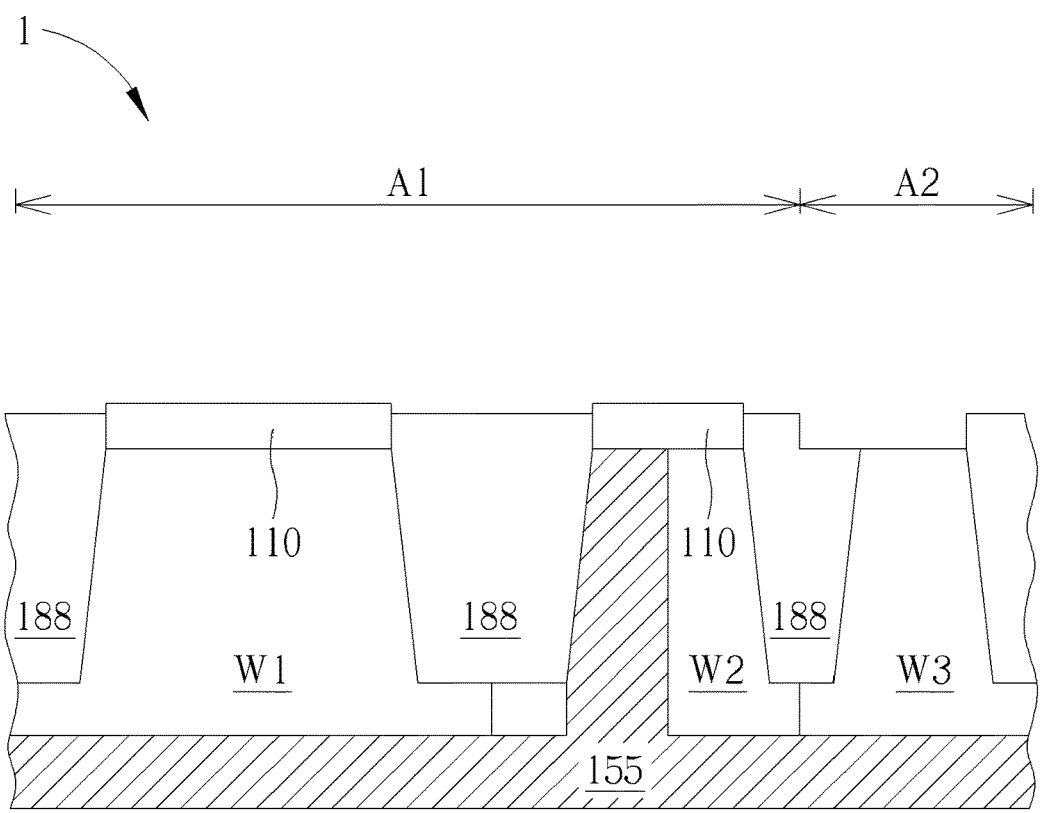
Figure 8:
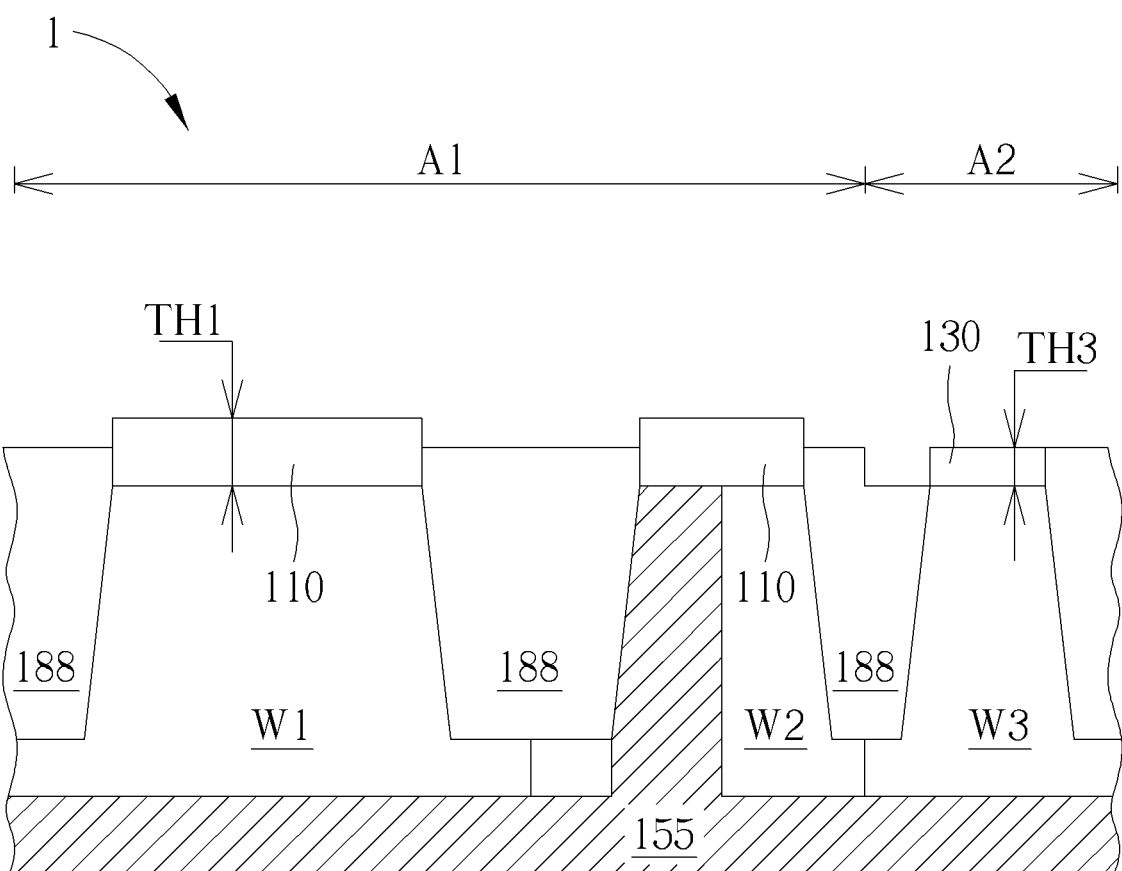

In Step S165 and FIG. 7, as in Step S145, an etching process may be performed to remove the second oxide layer 120. The etching process may also reduce the thickness of the first oxide layer 110; however, the thickness of the first oxide layer 110 can be increased afterward as described below.

In Step S170 and FIG. 8, as in Step S155, the thickness of the first oxide layer 110 may be increased along with the formation of the third oxide layer 130 from top or from bottom according to the type of the second oxidation process.

After performing the second oxidation process in Step S170, as shown in FIG. 8, the thickness TH1 of the first oxide layer 110 may be larger than the thickness TH3 of the third oxide layer 130.

For example, the thickness TH1 of the first oxide layer 110 may be 70 to 100 Å or even larger than 100 Å for a memory device on the area A1 to operate with an operation voltage of 3.3 volts.

The thickness TH3 of the third oxide layer 130 may be approximately 50 Å for the IO device formed on the area A2 to operate with an operation voltage of 2.5 volts.

The thicknesses and voltage described herein are merely examples instead of limiting the scope of the embodiments.

As shown in FIG. 8, the oxide layer 110 (of the memory device on the area A1) and the oxide 130 (of the IO device on the area A2) may have different thicknesses. The oxide layer for a memory device (aka memory cell) may be thicker. Because the oxide layer 130 is newly formed, the quality of the IO gate oxide layer can be optimized. By using the photomask and photoresist described in Step S140, the thicknesses of different oxide layers can be better controlled.

Figure 9:
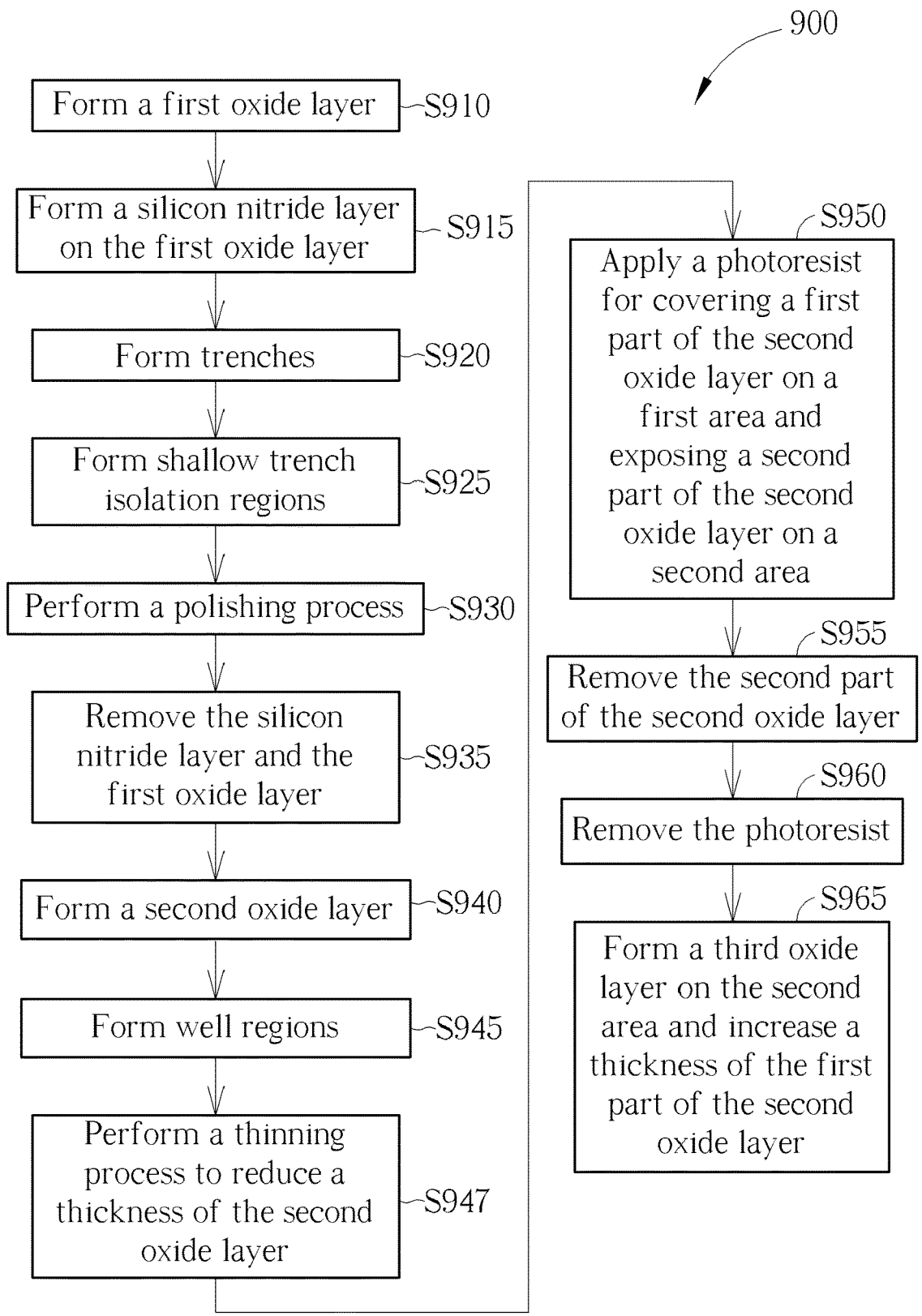
FIG. 9 is a flowchart of a method for manufacturing a semiconductor structure according to another embodiment.

FIG. 9 is a flowchart of a method 900 for manufacturing a semiconductor structure 9 according to an embodiment.

FIG. 10 to FIG. 13 are cross sectional views during the manufacturing process of the semiconductor structure 9.

Steps S910 to S930 in FIG. 9 may be similar to Steps S110 to S130 in FIG. 1 and corresponding to FIG. 2, so the steps are not repeatedly described, and the related structural cross-sectional views are not repeatedly shown.

Figure 10:
FIG. 10 to FIG. 13 illustrate the process of performing the method of FIG. 9.
Figure 10:
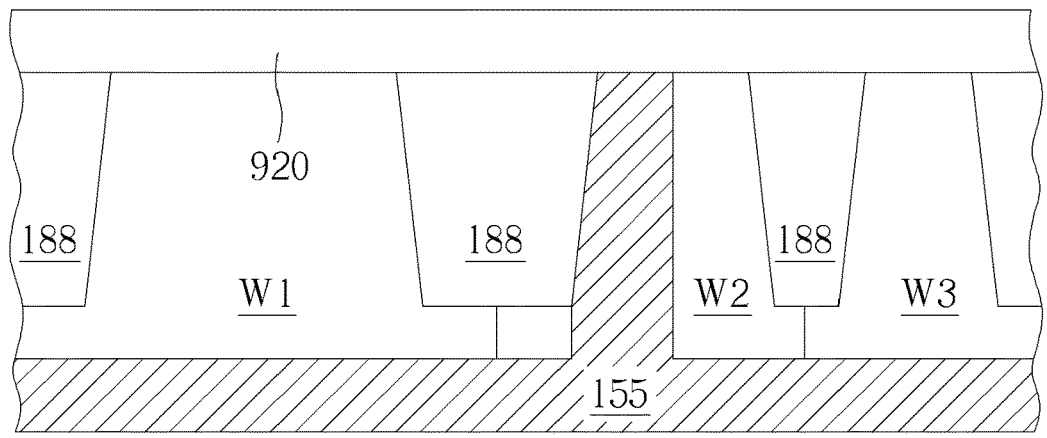

Steps S935 to S945 may be corresponding to FIG. 10. Step S947 may be corresponding to FIG. 11. Steps S950 and S955 may be corresponding to FIG. 12. Steps S960 and S965 may be corresponding to FIG. 13.

The method 900 may include the following steps.

Step S910: form a first oxide layer 110 on a wafer 155;

Step S915: form a silicon nitride layer 115 on the first oxide layer 110;

Step S920: form a plurality of trenches;

Step S925: fill an oxide material in the trenches to form a plurality of shallow trench isolation regions 188;

Step S930: perform a polishing process to planarize a surface of the silicon nitride layer 155;

Step S935: remove the silicon nitride layer 115 and the first oxide layer 110;

Step S940: form a second oxide layer 920;

Step S945: implant ions to form a plurality of well regions W1, W2 and W3;

Step S947: perform a thinning process to reduce a thickness of the second oxide layer 920;

Step S950: use a photomask to apply a photoresist 966 for covering a first part of the second oxide layer 920 on a first area A1 and exposing a second part of the second oxide layer 920 on a second area A2;

Step S955: remove the second part of the second oxide layer 920 while remaining the first part of the second oxide layer 920;

Step S960: remove the photoresist 966; and

Step S965: perform an oxidation process to form a third oxide layer 930 on the second area A2 and increase a thickness of the first part of the second oxide layer 920.

In FIG. 10 to FIG. 13, the oxide layer 920 may be a sacrificial oxide layer, and the oxide layer 930 may be a gate oxide layer of an input/output device (IO gate oxide layer).

In FIG. 10, the thickness TH92 of the oxide layer 920 may be 90 Å to 120 Å.

Figure 11:
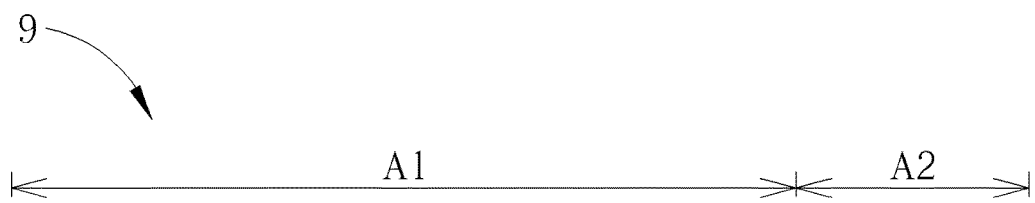
Figure 11:
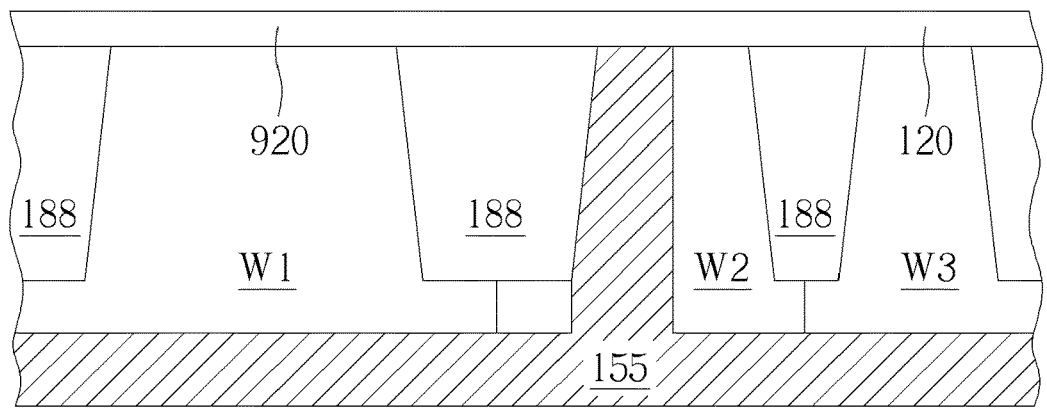

In FIG. 11 and Step S947, the thinning process may be (but not limited to) an etching process. The thickness TH92 of the oxide layer 920 may be 40 Å to 80 Å after the thinning process is performed.

Figure 12:
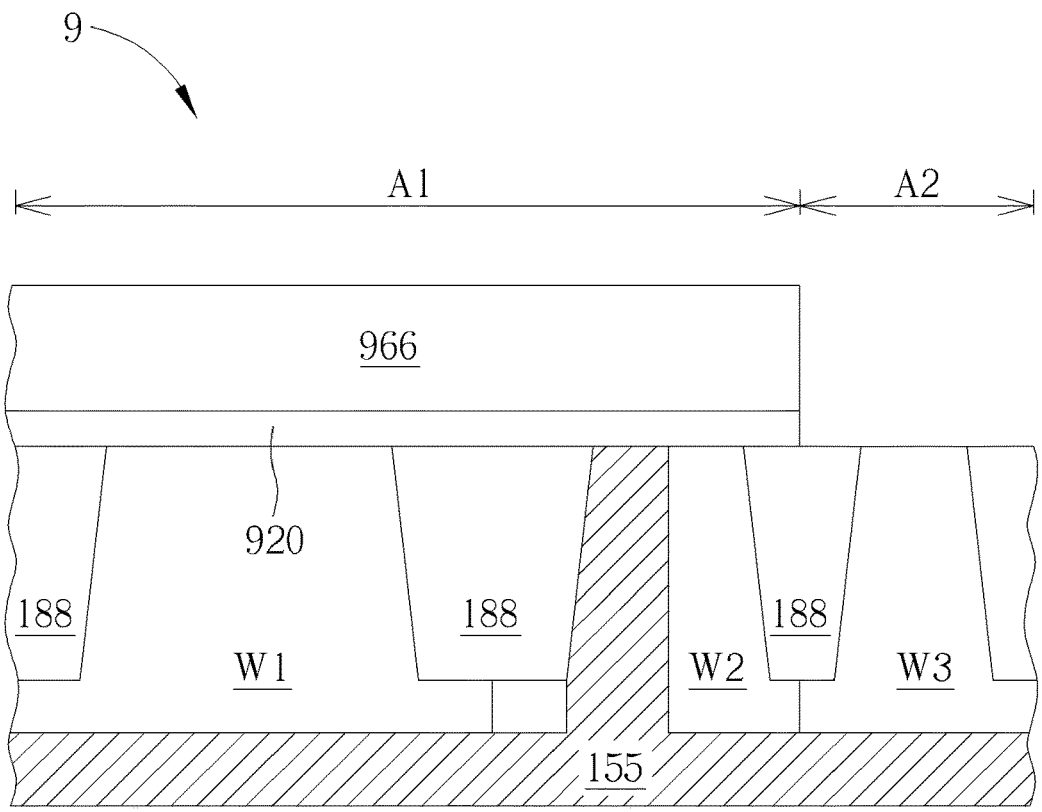

In FIG. 12 and Step S950, the photoresist 966 may be similar to the photoresist 166 in FIG. 4, and be used to retain the oxide layer 920 on the first area A1, where a memory device can be formed in the first area A1. The thickness TH92 of the oxide layer 920 in FIG. 11 may be kept the same in FIG. 12. In Step S955, the oxide layer 920 on the area A2 may be removed by etching.

Figure 13:
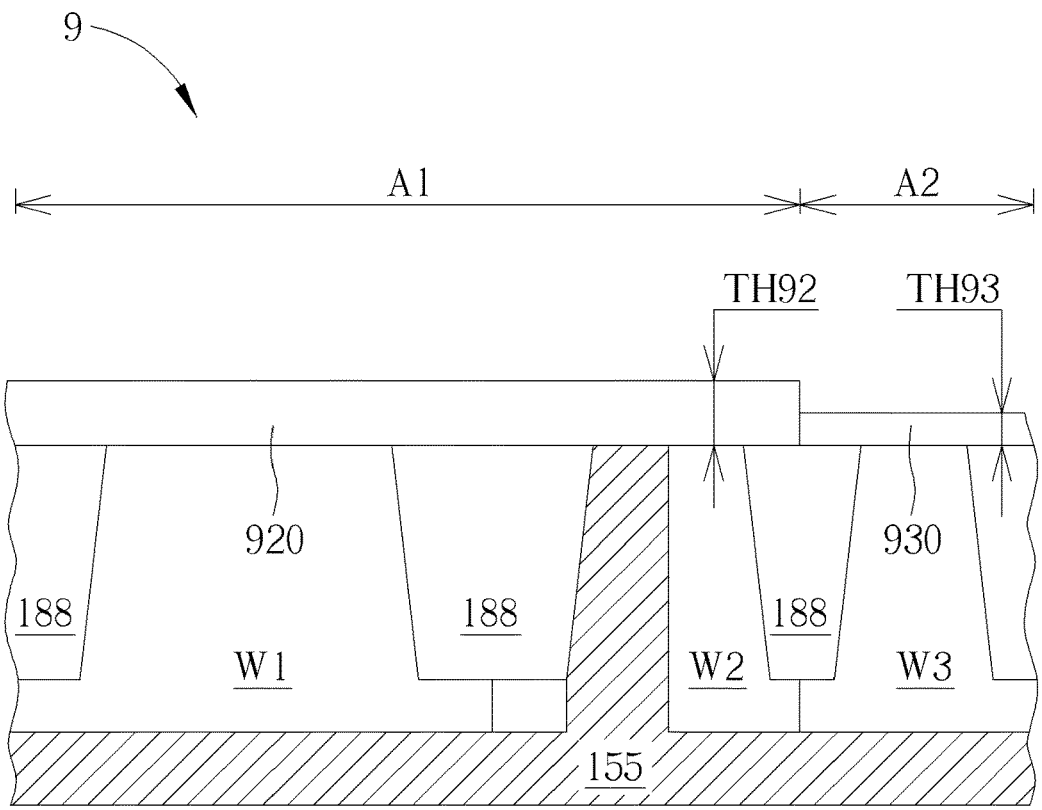

In FIG. 13 and Step S965, the oxidation process may include one of a CVD process, a PVD process, a PECVD process and a thermal oxidation process. The thickness TH92 of the oxide layer 920 in FIG. 13 may be increased from top or from bottom according to the type of the oxidation process in Step S965.

In FIG. 13, after performing the oxidation process, the thickness TH92 of the oxide layer 920 may be larger than the thickness TH93 of the oxide layer 930.

For example, in FIG. 13, the thickness TH92 may be increased to be 90 Å to 120 Å, and the thickness TH93 may be approximately 50 Å.

A memory device may be formed in the area A1, and an IO device may be formed in the area A2. According to the thicknesses TH92 and TH93 in FIG. 13, the memory device may operate with an operation voltage of 3.3 volts, and the IO device may operate with an operation voltage of 2.5 volts.

In FIG. 13, as in FIG. 8, the oxide layer for a memory device (aka memory cell) may be thicker. Because the oxide layer 930 is newly formed, the quality of the IO gate oxide layer can be optimized. By using the photomask and photoresist described in Step S950, the thicknesses of different oxide layers can be better controlled.

Figure 14:
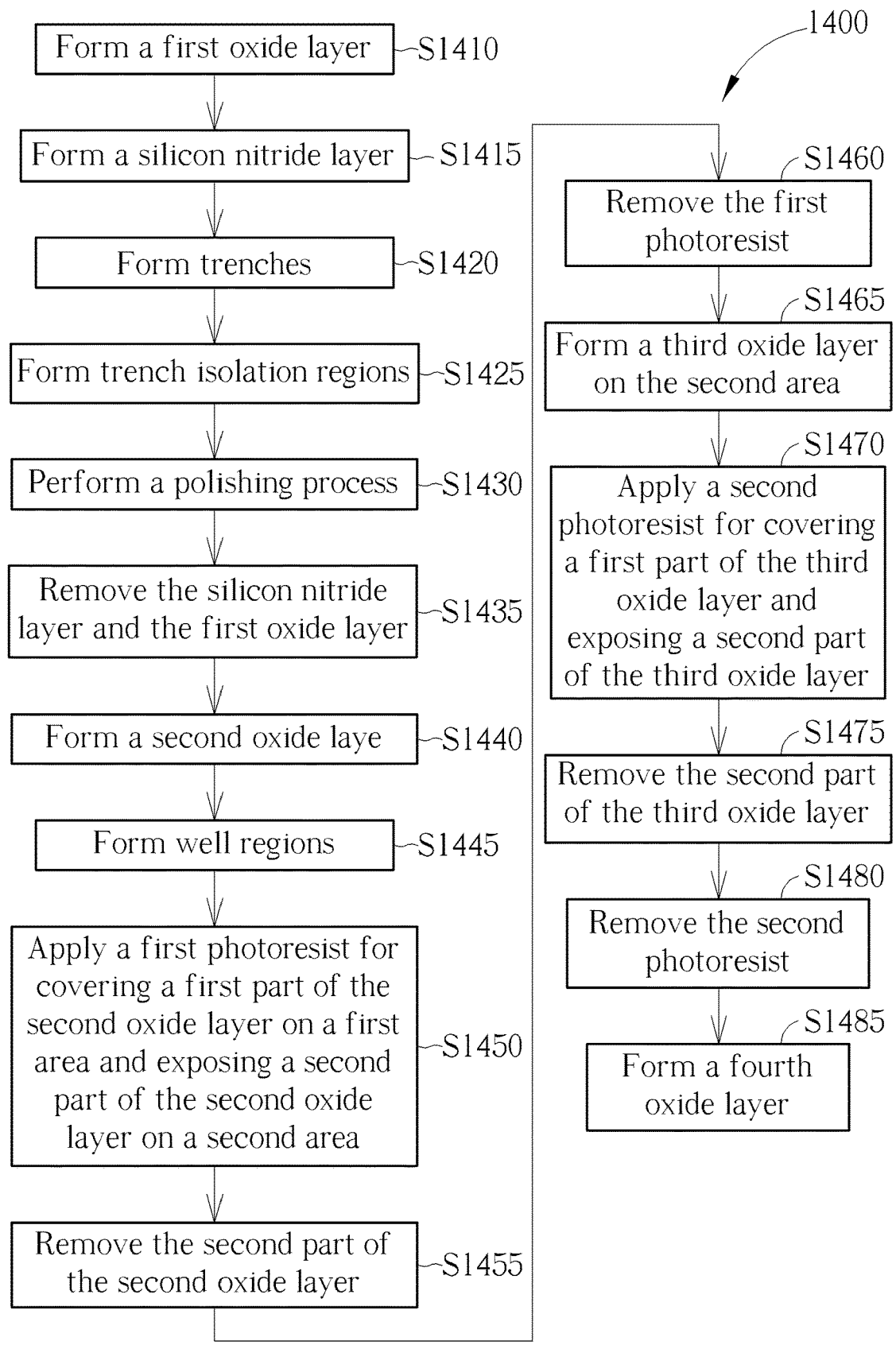
FIG. 14 is a flowchart of a method for manufacturing a semiconductor structure according to another embodiment.

FIG. 14 is a flowchart of a method 1400 for manufacturing a semiconductor structure 14 according to an embodiment. FIG. 15 to FIG. 20 are cross sectional views during the manufacturing process of the semiconductor structure 14. In FIG. 14, Steps S1410 to S1445 may be similar to Steps S910 to S945 in FIG. 9, so the steps are not repeatedly described, and the related structures similar to FIGS. 2 and 10 are not repeatedly shown.

However, in FIG. 14, because more shallow trench isolation region(s) 188 may be formed, the number of trenches may be different from that of FIG. 9.

Figure 15:
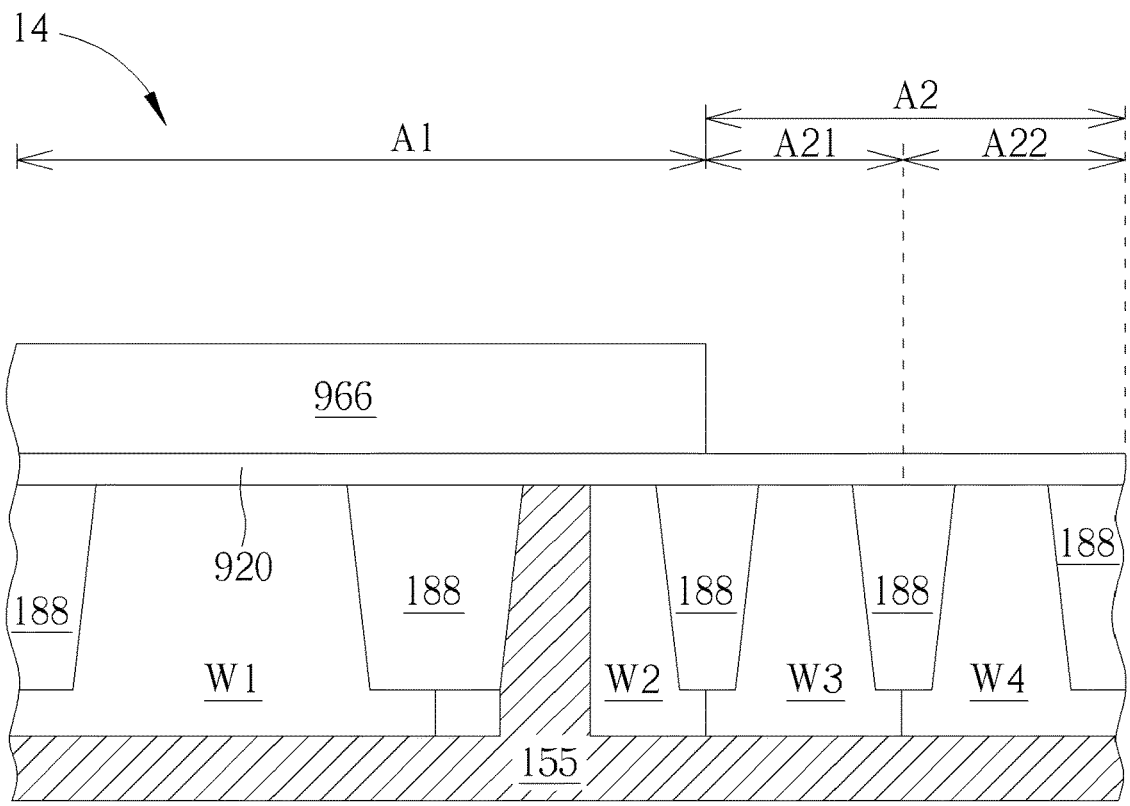
FIG. 15 to FIG. 20 illustrate the process of performing the method of FIG. 14.

In FIG. 14, Steps S1445 and S1450 may be corresponding to FIG. 15. Step S1455 may be corresponding to FIG. 16. Steps S1460 and S1465 may be corresponding to FIG. 17. Step S1470 may be corresponding to FIG. 18. Step S1475 may be corresponding to FIG. 19. Steps S1480 and S1485 may be corresponding to FIG. 20.

As shown in FIG. 14, the method 1400 may include following steps.

Step S1410: form a first oxide layer 110 on a wafer 155;

Step S1415: form a silicon nitride layer 115 on the first oxide layer 110;

Step S1420: form a plurality of trenches;

Step S1425: fill an oxide material in the trenches to form a plurality of shallow trench isolation regions 188;

Step S1430: perform a polishing process to planarize a surface of the silicon nitride layer 155;

Step S1435: remove the silicon nitride layer 115 and the first oxide layer 110;

Step S1440: form a second oxide layer 920;

Step S1445: implant ions to form a plurality of well regions W1, W2, W3 and W4;

Step S1450: use a first photomask to apply a first photoresist 966 for covering a first part of the second oxide layer 920 on a first area A1 and exposing a second part of the second oxide layer 920 on a second area A2;

Step S1455: remove the second part of the second oxide layer 920 while retaining the first part of the second oxide layer 920;

Step S1460: remove the first photoresist 966;

Step S1465: perform a first oxidation process to form a third oxide layer 930 on the second area A2 and increase a thickness of the first part of the second oxide layer 920;

Step S1470: use a second photomask to apply a second photoresist 1466 for covering a first part of the third oxide layer 930 and exposing a second part of the third oxide layer 930;

Step S1475: perform an etching process to remove the second part of the third oxide layer 930 and reduce the thickness of the first part of the second oxide layer 920;

Step S1480: remove the second photoresist 1466; and

Step S1485: perform a second oxidation process to form a fourth oxide layer 1440, increase the thickness of the first part of the second oxide layer 920, and increase a thickness of the first part of the third oxide layer 930.

In Step S1445, compared with Step S945 of FIG. 9, a well W4 may be further formed.

Compared with FIG. 9, as shown in FIG. 14, Step S947 of FIG. 9 may be selectively omitted so as not to thin the second oxide layer 920.

In FIG. 14 to FIG. 20, the wells W1 and W3 may be n-type wells, and the wells W2 and W4 may be p-type wells. However, this is merely an example instead of limiting the scope of the embodiments.

Figure 20:
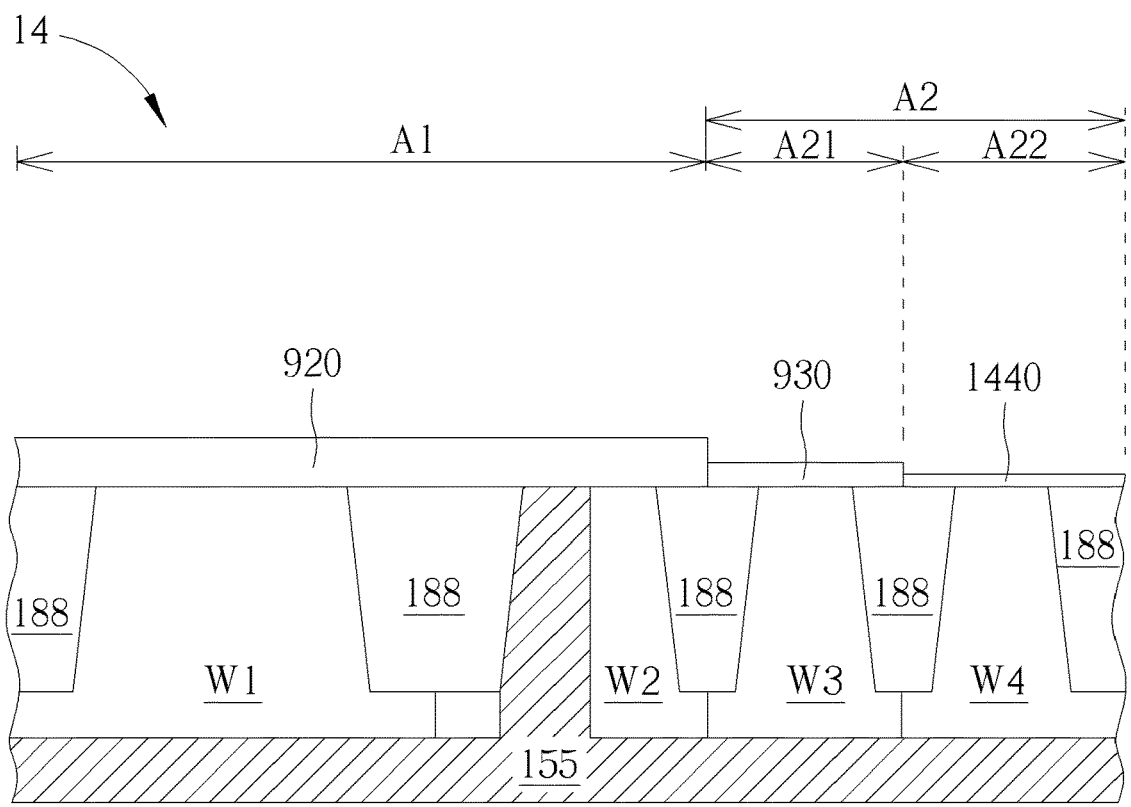

In FIG. 14, the first oxide layer 110 (as shown in FIG. 2) may be a pad oxide layer, the second oxide layer 920 (as shown in FIG. 20) may be a sacrificial oxide layer, the third oxide layer 930 (as shown in FIG. 20) may be a gate oxide layer of an input/output device (IO gate oxide layer), and the fourth oxide layer 1440 (as shown in FIG. 20) may be an oxide layer of a core device. For example, a core device may include a circuit formed with logic gate components.

Figure 18:
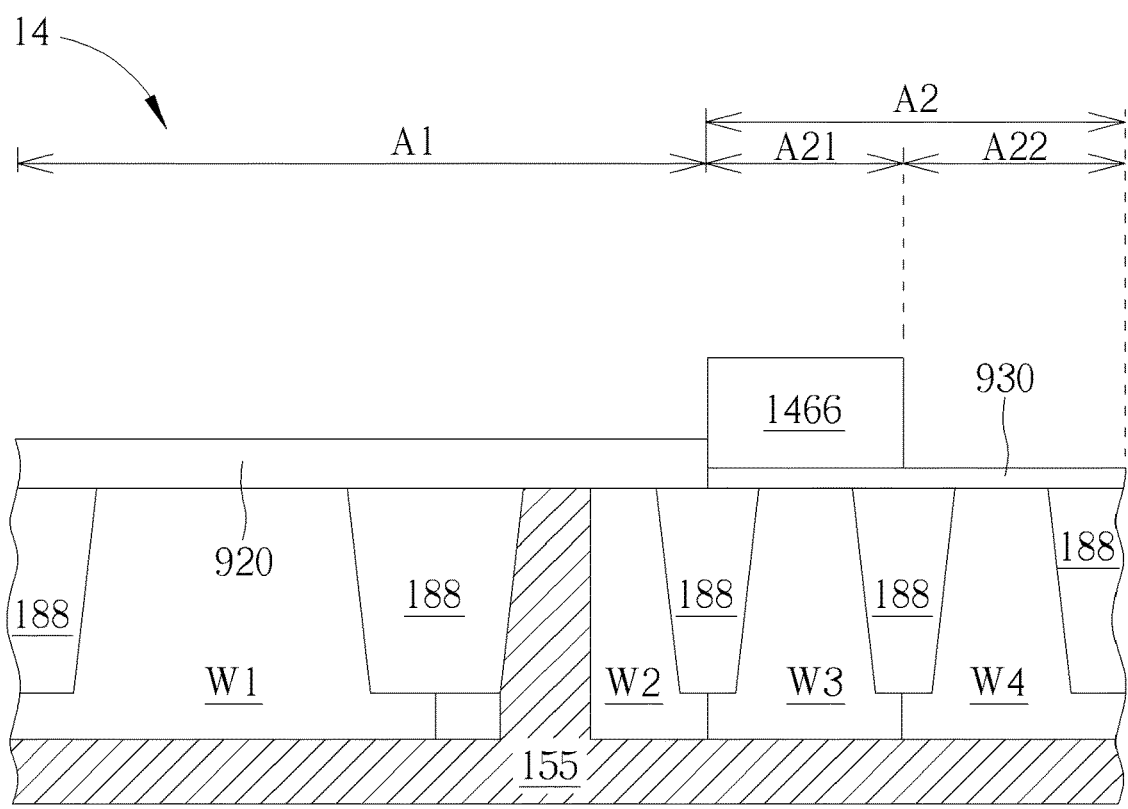

In FIG. 18 and Step S1470, the first part of the third oxide layer 930 may be on the first part A21 of the second area A2, and the second part of the third oxide layer 930 may be on the second part A22 of the second area A2.

The first area A1 may be corresponding to a memory device. The first part A21 of the second area A2 may be corresponding to an IO device. The second part A22 of the second area A2 may be corresponding to a core device.

Regarding the methods shown in FIG. 1, FIG. 9 and FIG. 14, the second oxide layer 920 may be annealed after implanting the ions to enhance the quality of the oxide layer 920.

In Step S965 and Step S1485, each of the first oxidation process and the second oxidation process may include one of a physical vapor deposition (PVD) process, a chemical vapor deposition (CVD) process, a plasma-enhanced chemical vapor deposition (PECVD) process and a thermal oxidation process.

Figure 16:
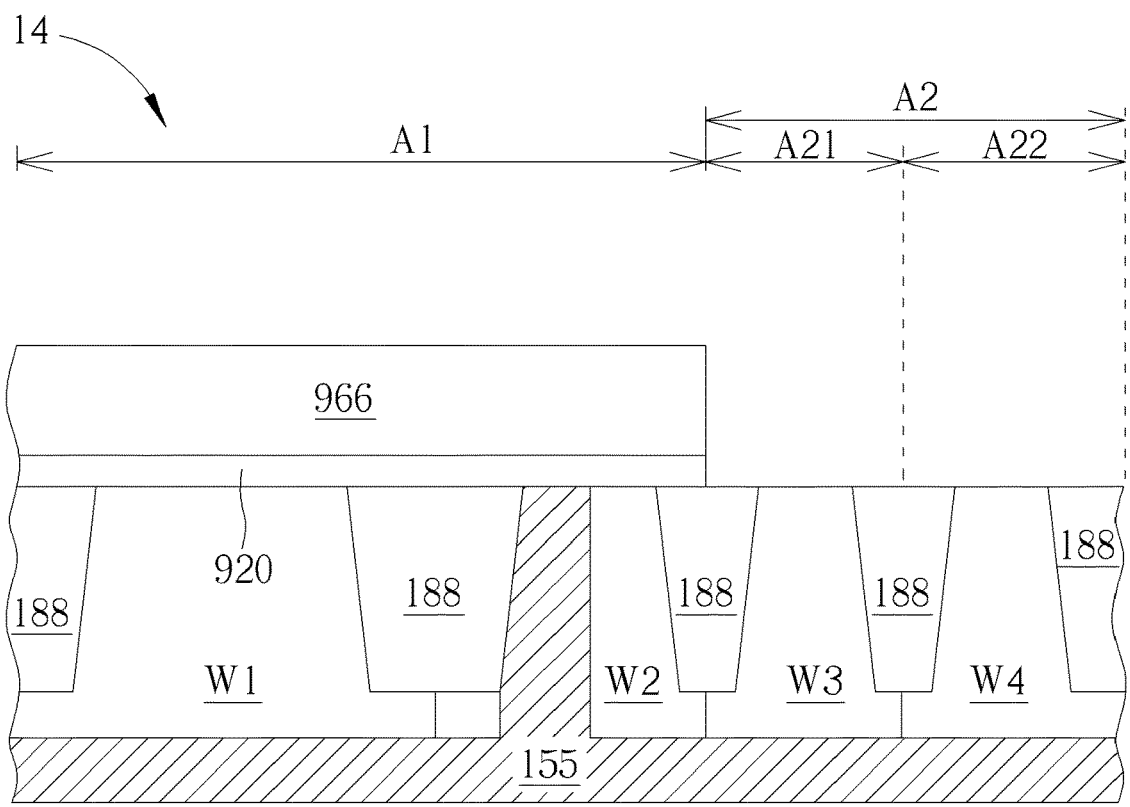

In FIG. 15 and FIG. 16, the thickness of the oxide layer 920 may be 90 Å to 120 Å.

Figure 17:
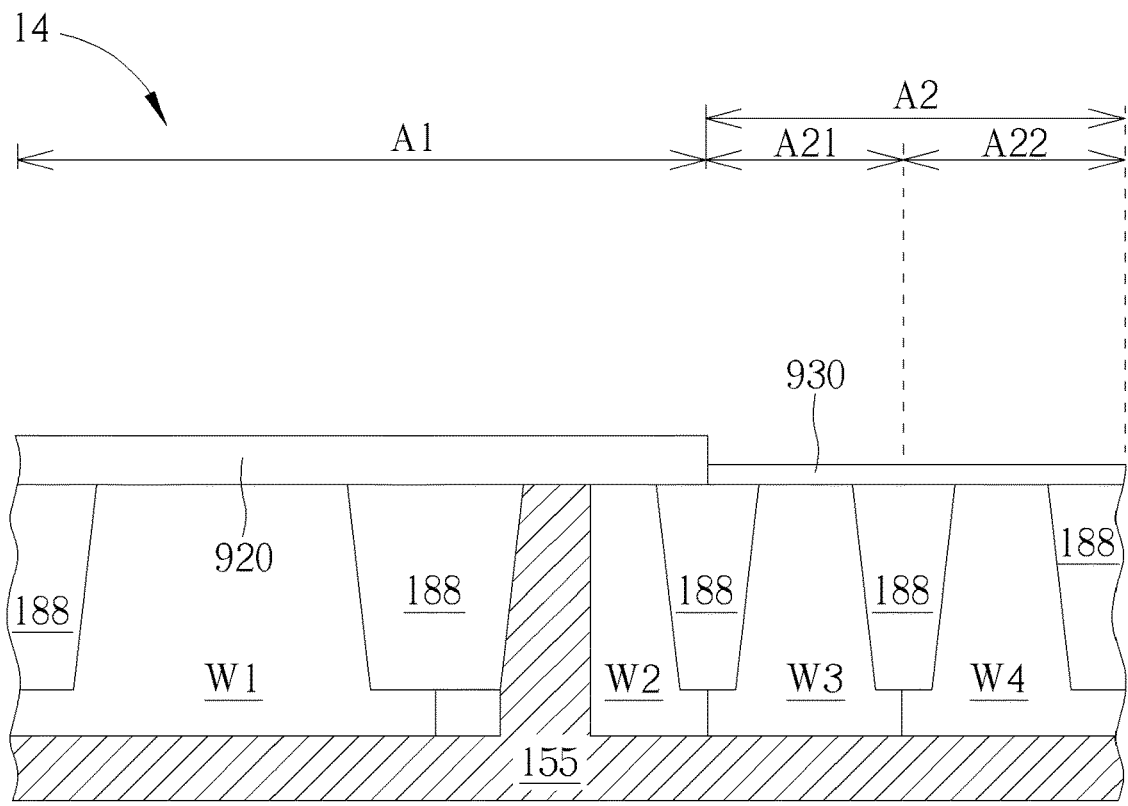

In FIG. 17 and FIG. 18, the thickness of the oxide layer 920 may be increased to 140 Å to 170 Å. The thickness of the oxide layer 930 may be approximately 50 Å.

Figure 19:
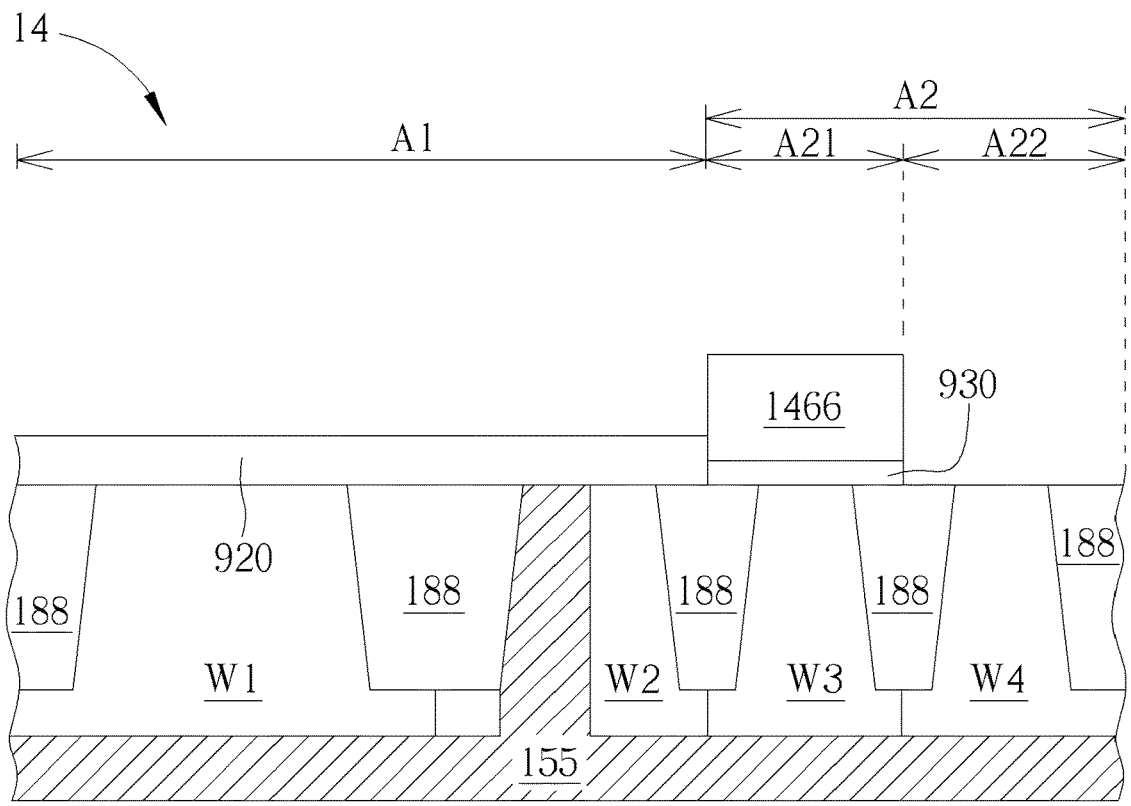

In FIG. 19, the thickness of the oxide layer 920 may be reduced to 90 Å to 120 Å. The thickness of the oxide layer 930 may be approximately 50 Å. The abovementioned thicknesses are merely of an example for describing the changes of the thicknesses of oxide layers in different stages instead of limiting the scope of the embodiments.

As shown in FIG. 20, after performing Step S1485, the thickness of the second oxide layer 920 may be larger than the thickness of the third oxide layer 930. The thickness of the third oxide layer 930 may be larger than the thickness of the fourth oxide layer 1440. The thickness of the oxide layer 1440 may be less than 50 Å.

After performing Step S1485, a standard (STD) logic process flow may be performed to fabricate a core device.

In summary, according to methods shown in FIG. 1, FIG. 9 and FIG. 14, by applying the photoresist 966 and/or the photoresist 1466 mentioned above, oxide layers of a memory device, an IO device and a core device may be separately and accurately formed to have different thicknesses. Hence, the memory device can be better programmed and erased and have improved reliability, and the IO cell can be operated with a proper operation voltage such as 3.3 volts, 5 volts, 2.5 volts or 1.8 volts. Advanced manufacture processes can be better applied to fabricate the IO device and the memory device with fewer problems related to oxide layers. The problems of the field can hence be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a semiconductor structure, the method comprising:
   forming a first oxide layer on a wafer;
   forming a silicon nitride layer on the first oxide layer;
   forming a plurality of trenches;
   filling an oxide material in the trenches to form a plurality of shallow trench isolation regions;
   performing a polishing process to planarize a surface of the silicon nitride layer;
   removing the silicon nitride layer and the first oxide layer;
   forming a second oxide layer;
   implanting ions to form a plurality of well regions;
   using a first photomask to apply a first photoresist for covering a first part of the second oxide layer on a first area and exposing a second part of the second oxide layer on a second area; and
   removing the second part of the second oxide layer while remaining the first part of the second oxide layer.

2. The method of claim 1, further comprising performing a thinning process to reduce a thickness of the second oxide layer.

3. The method of claim 1, further comprising:
   removing the first photoresist; and
   performing an oxidation process to form a third oxide layer on the second area and increase a thickness of the first part of the second oxide layer.

4. The method of claim 3, wherein the first oxide layer is a pad oxide layer, the second oxide layer is a sacrificial oxide layer, and the third oxide layer is a gate oxide layer of an input/output device.

5. The method of claim 3, wherein the thickness of the first part of the second oxide layer is larger than a thickness of the third oxide layer after performing the oxidation process.

6. The method of claim 1, wherein the first area is corresponding to a memory device, and the second area is corresponding to an input/output device.

7. The method of claim 1, further comprising:
   removing the first photoresist;
   performing a first oxidation process to form a third oxide layer on the second area and increase a thickness of the first part of the second oxide layer; and
   using a second photomask to apply a second photoresist for covering a first part of the third oxide layer and exposing a second part of the third oxide layer;
   wherein the first part of the third oxide layer is on a first part of the second area,
   and the second part of the third oxide layer is on a second part of the second area.

8. The method of claim 7, further comprising:
   performing an etching process to remove the second part of the third oxide layer and reduce the thickness of the first part of the second oxide layer;
   removing the second photoresist; and
   performing a second oxidation process to form a fourth oxide layer on the second part of the second area, increase the thickness of the first part of the second oxide layer, and increase a thickness of the first part of the third oxide layer.

9. The method of claim 8, wherein the first oxide layer is a pad oxide layer, the second oxide layer is a sacrificial oxide layer, the third oxide layer is a gate oxide layer of an input/output device, and the fourth oxide layer is an oxide layer of a core device.

10. The method of claim 8, wherein the thickness of the first part of the second oxide layer is larger than the thickness of the first part of the third oxide layer, and the thickness of the first part of the third oxide layer is larger than a thickness of the fourth oxide layer.

11. The method of claim 7, wherein the first area is corresponding to a memory device, the first part of the second area is corresponding to an input/output device, and the second part of the second area is corresponding to a core device.

12. The method of claim 1, wherein the polishing process comprises a chemical-mechanical polishing process.

13. The method of claim 1, further comprising annealing the second oxide layer after implanting the ions.

* * * * *